United States Patent Office 3,717,483

Patented Feb. 20, 1973

3,717,483

METALLIZING COMPOSITION

Lewis F. Miller, La Grangeville, N.Y., assignor to International Business Machines Corporation, Armonk, N.Y.

No Drawing. Continuation-in-part of application Ser. No. 542,726, Apr. 15, 1966. This application Apr. 22, 1969, Ser. No. 818,410

Int. Cl. C09d 5/24

U.S. Cl. 106—1 12 Claims

ABSTRACT OF THE DISCLOSURE

A metallizing composition adapted to be deposited on an insulating substrate and fired to form a conductive element thereon comprises: a metal powder component of, by weight 40–70% gold, 5–25% silver and 15–35% of platinum and/or palladium; finely divided vitreous frit for bonding the particles together and to the substrate; and, vehicle in which the metal and frit particles are dispersed. The metal powder component comprises, by weight, 60–72% of the total formula, the vitreous frit 6–10% and the vehicle 22–30%.

CROSS-REFERENCE TO RELATED APPLICATION

This is a continuation-in-part of U.S. application Ser. No. 542,726 of Lewis F. Miller, filed Apr. 15, 1966, now abandoned.

BACKGROUND OF THE INVENTION

The present invention relates to a metallizing composition. In particular, the invention is directed to a composition for the production of fired-on metal coatings which may serve as electrically conductive contacts, land patterns or the like.

As is known in the art, metal films including electrical contact layers may be deposited by firing a coating composition composed of metal particles and finely divided flux materials or frit dispersed in a suitable vehicle. The composition is deposited as a paste or flowable substance onto a substrate. Suitable masks or templates may be employed to control the configuration of the deposit. On heating to elevated temperatures, the vehicle is volatilized or decomposed and the vitreous frit fuses, thus wetting the substrate and bonding the dispersed metal particles.

Various metallizing pastes and fluids containing noble metals and noble metal oxides in combination with vitreous flux materials are known in the art, but their use has been attended by certain disadvantages. For example, the resulting films in some cases do not possess the desired conductivity or solderability. In addition, the contacts or lands deposited from such compositions frequently are porous and may be incompatible with certain low resistance glaze resistors.

An overriding problem with all of the common electrode pastes is combining good adhesion, conductivity, compatability with passive elements, such as glaze resistors, and solderability, within the bounds of reasonable cost.

In some instances electric contacts deposited from such compositions are also characterized by migration of a portion of the metal component. For example, under conditions of high humidity and voltage, silver bearing materials can plate out on cathodic regions of the circuit, ultimately forming dendrites which can travel to and electrically short out on adjacent anode regions. At very high power levels, silver migration has been known to occur at temperatures as high as 150° C.

Thus, it is an objective of the present invention to provide a metallizing composition from which fired-on metal films, especially conductive metal contact films, may be deposited, the contact films being characterized by high conductivity, solderability, density and relatively low cost.

It is a further objective of the present invention to provide metallizing compositions from which electrical contact layers may be deposited by firing, the resulting films being characterized by absence of migration.

Another object of the present invention is to provide a metallizing composition which may be employed to yield fired-on electrical films which are compatible with and provide low contact resistance with other electrical components, such as glaze resistors and the like.

SUMMARY OF THE INVENTION

In accordance with the present invention, there is provided a metallizing composition for the production of fired-on, conductive films comprising (A) a metal powder component composed of gold, silver, and platinum and/or palladium, (B) a vitreous frit component and (C) a vehicle.

The metal powder component of the composition may comprise from 40 to 70% gold, from 5 to 25% silver and from 15 to 35% platinum and/or palladium.

Very satisfactory results are obtained with a composition as described above in which the metal powder component is composed of 55% gold, 20% silver and 25% platinum and/or palladium, all in parts by weight. While the use of platinum in the composition affords similar advantages to the use of palladium, and can be intermixed therewith, palladium is generally preferred due to its lower cost.

The composition is formed by mixing the noble metal particles and the vitreous frit component with the vehicle. The noble metal particles and vitreous frit can be shifted through a very fine mesh screen and then mixed until completely homogeneous. A vehicle is then mixed with the metal particles and vitreous frit until a homogeneous paste is formed.

In use, the paste is applied to a substrate, for example, a sheet of ceramic dielectric, in the desired pattern by conventional coating techniques. The applied paste on the ceramic substrate is fired at an elevated temperature, above approximately 600° C., and preferably 750–900° C., to form a conductive element. The element on the substrate is then allowed to cool to room temperature.

DESCRIPTION OF THE PREFERRED EMBODIMENTS

The following is a summary of a method for fabricating a conductive element pattern using the novel metallizing composition.

Gold, silver, platinum and/or palladium, powders, and the vitreous frit, are sifted through a 325 mesh screen using gentle shaking. Only powders passing through the screen are used in succeeding steps to avoid the presence of large particles.

Silver is preferably used as a non-flake powder having a diameter of from 1 to 5 microns with a surface area of about 1 $m.^2$/gm. (B.E.T.) and apparent density of about 5–15 gms./$in.^3$ (Scott volumeter). Flake particles tend to create excessive gelation, pigment flotation, and sometimes "flake-out" during milling of the paste. Large particles can cause screening difficulty and in homogeneous dispersion.

Gold is preferably used as a non-flake powder for similar reasons. The malleable gold can readily be squeezed into agglomerates during a 3 roll milling. Particles having a diameter of from 1–10 microns in diameter, with surface area about 2 $m.^2$/gm. (B.E.T) and apparent density about 15–20 gms./$in.^3$ (Scott volumeter) are preferred.

The size and surface area of the platinum and/or palladium powder strongly affects the density of the fired material. High surface area material over about 15 $m.^2/gm.$ (B.E.T.) tends to shrink in volume considerably during subsequent firing processes and tends to create cracks or fissures in the electrode. Thus, 10 $m.^2/gm.$ size material is desirable and under 5 $m.^2/gm.$ is preferred. All of the precious metals should, of course, be of high purity.

The vitreous frit component of the present invention is a finely divided glassy material which fuses at the temperatures of firing. Preferably, the frit comprises lead bisilicate, bismuth trioxide and lead borosilicate glass. The vitreous frit should be very finely divided both to insure excellent dispersion among the metal particles for uniformity and also to prevent clogging of the screen mesh. It is desirable to sieve the particles through 325 or 400 mesh. Preferred particle size of the frit is from 1 to 20 microns. In a preferred embodiment, the frit is composed of 45% lead bisilicate, 30% bismuth trioxide and 25% lead borosilicate glass, all in parts by weight.

The lead bisilicate should be in the ratio: 1.0 PbO:0.03 $Al_2O_3$:1.95 $SiO_2$. Higher silica or alumina ratios tend to interfere somewhat with soldering of the fired lands. Lower silica or alumina ratios do not provide quite as much adherence of the fired lands to the substrate.

The lead borosilicate glass has an effect on adhesion, tinability and fissuring of the lands. As an illustration, some of the effects of three borosilicate glasses are compared below. The glasses are used with the same metal powder component comprising 55% gold, 20% silver and 25% palladium.

| Glass | Adhesion, p.s.i. | Fissuring |
|---|---|---|
| A | 2,900 | Good. |
| B | 3,200 | Poor. |
| C | 2,600 | Fair. |

The formulae of the glasses used in the above comparison are set forth below. Glass A is a preferred formulation.

GLASS FORMULAE

| | A | B | C |
|---|---|---|---|
| $Al_2O_3$ | 2.0 | 3.2 | 2.0 |
| $SiO_2$ | 22.4 | 30 | 10.4 |
| PbO | 66.6 | 51 | 84.7 |
| $B_2O_3$ | 8.8 | 9 | 2.9 |
| $ZrO_2$ | | 1.1 | |
| $TiO_2$ | | 2 | |
| $Na_2O$ | | 1.3 | |
| CdO | | 3 | |

The dry metal powders together with the vitreous frit are placed in a non-contaminating container and are uniformly mixed by means of a mechanical shaker. The uniformly mixed powders and frit are now ready to be mixed with a vehicle.

The vehicle used for the metallic powder preferably includes a vaporizable solid, a resinous binder and a solvent for the vaporizable solid and binder. The vaporizable solid in the vehicle results in a printed line having essentially stable dimensions. Examples of useful vaporizable solids are terephthalic acid, furoic acid and ammonium compounds, such as ammonium carbonate and ammonium sulfate. The binder material is used to retain the powders and frit on the substrate when the solvent and a vaporizable solid have been removed. Examples of binders include natural gums, synthetic resins, cellulose resinous materials and the like. The solvent is selected so that it will dissolve the binder and dissolve or disperse the vaporizabole solid used in the vehicle. Commonly used solvents are the higher boiling paraffins, cycloparaffins and aromatic hydrocarbons or mixtures thereof or one or more of the mono- and di-alkyl ethers of diethylene glycol or their derivatives, such as diethylene glycol monobutyl ether acetate.

The elements of the vehicle are normally premixed before mixing with metallic powder and vitreous frit. A more complete description of the vehicle, its components and desirable properties is found in the U.S. patent application, Ser. No. 334,544, filed Dec. 30, 1963, which is assigned to the assignee of the present invention abandoned in favor of a continuation application, Ser. No. 573,171, filed Aug. 18, 1966, now U.S. Pat. No. 3,414,417, issued Dec. 3, 1968. In addition, if desired, non-ionic surfactants, such as nonyl phenoxy polyoxyethanol, may be used to modify further the flow properties. It is preferred that ionic surfactants containing metal ions not be used due to the possibility of doping associated glaze resistors or capacitors. However, any applicable surfactants may be used, if such limitations are not present.

The pre-mixed metal powders and frit are combined with the inert vehicle and a suitable surfactant, when desired, and are thoroughly and homogeneously mixed until a paste of the desired viscosity is formed. Standard mixing apparatus may be used, such as mortar and pestle, a blade type mixer or the like. There is no need for attrition. The mixing phase is needed only for homogeneity and to avoid breaking out of metal powder in the subsequent milling operation. The second part of the mixing operation is a milling step. A three roll mill is preferably used to disperse further the metal powder in the vehicle. The mill temperature should not be allowed to rise much above room temperature to avoid excess volatilization of the vehicle. The paste is removed from the mill and is now ready for application to a substrate.

The metal powder component should comprise, by weight, 60–72% of the total formula, the vitreous frit 6–10%, and the vehicle 22–30%. The metal powders and frit particles are incorporated in the vehicle in an amount sufficient to produce a composition containing from 70–78% solids.

If the concentration of the metal powder component is too low, the conductance will be low; if too high fissuring of the fired lands may result. Also, the paste might clog during screening.

The amount of frit used in the formula effects adhesion and tinability. A preferred frit concentration is 8 to 9% by weight of the total formula. If frit concentration is too low, adhesion is too low; if too high tinability suffers.

The amount of vehicle used in the formula has an effect on the fissuring and porosity of the fired land. Very low vehicle concentrations tend to permit more fissuring. For this reason 78% by weight of solids (or 22% by weight of liquid vehicle) is preferred.

After the composition has been formed and a homogeneous dispersion has been achieved, it may be applied to any suitable substrate by spraying, brushing or other technique well known in the art. A conductive element is printed onto a dielectric substrate by silk screening or other conventional printing processes. The substrate is, of course, thoroughly cleaned and freed from grease or other extraneous material before printing is attempted. A silk screen having the desired circuit pattern is placed over the clean substrate. The paste is squeegeed, doctored, or extruded onto the screen. Pressure is applied to spread the paste through the screen and onto the substrate. The pattern in the screen is reproduced at a thickness determined by a number of variables, such as squeegee pressure and angle, paste viscosity, screen openings, and mask thickness. The screen is removed from the substrate and the printed metalizing paste composition is ready to be dried and fired. The printed pattern is dried at room temperature or above, but preferably at 75° C. to 150° C. for one-half hour. Most of the liquid is thereby removed and the resulting printed pattern is a solid.

After application to a substrate according to the desired pattern, the coating is fired in air at a temperature in the range of from 750° to 900° C. and preferably about 835° C.

It is believed that the present invention will be more fully appreciated in the light of the following detailed examples.

EXAMPLE I 70 grams of powdered metals having a size finer than about 325 mesh and composed of 55% gold, 20% silver and 25% palladium are mixed with 8.5 grams of a frit. The frit is composed of 45% lead bisilicate, 30% bismuth trioxide and 25% lead borosilicate glass. 78 grams of the metal powders and frit were then dispersed in 22 grams of an inorganic vehicle. The composition was blended until a homogeneous dispersion of the solids in the vehicle was obtained. A thin film of the composition was then deposited on an alumina substrate. The film was fired at 835° C. for 30 minutes. Adhesion tests show that the films resist a parting force on the order of 2900 p.s.i. The test was conducted by adhering a copper rivet to the film with a 10:90, Sn-Pb, solder and pulling the film from the substrate by means of an Instron Tester at the rate of .02 inch per minute. The film showed good conductance, lower porosity and the cost is about half that of comparable, non-migrating, gold-platinum metal electrode paste compositions.

When tested for migration under a high field, i.e., 40 v., across a 5 mil gap, with a water drop bridging the gap, no migration was evident in five minutes time, whereas pure silver electrodes migrated almost instantaneously under these conditions as evidenced by dendrite growth and electrical leakage. The film also tinned well when wet with a standard 10:90, Sn-Pb, solder at 625° F. for about ten seconds using a rosin solder flux.

EXAMPLE II

Successive replacements of gold with silver were made in a platinum-gold formulation and the resulting pastes were screened and fired to form land patterns on alumina ceramics. A low resistance value palladium:silver glaze resistor paste, of the type described in copending application, Ser. No. 313,032 of Mones et al., filed Oct. 1, 1963, and assigned to the assignee of the present application, now U.S. Pat. No. 3,248,345, issued Apr. 26, 1966, was then screened and fired making appropriate contact between three resistors of different size on each substrate and the lands. Inert platinum lands, which provide known good contact to such a glaze resistor, were used as controls. As can be seen from Table I following, the resistance values and scaling of resistance values for resistors of different size improved considerably with the higher silver contents and matched the control at the 20% silver level. The resistor is composed of a ratio of 90 parts of palladium oxide doped with 0.5% $Li_2CO_3$ to 100 parts of silver flake, combined with 60% by weight of glass B above.

TABLE I

| | Desired value | Pt control | 80 Au:20 Pt | 70 Au:20 Pt:10Ag | 60Au:20 Pt:20 Ag |
|---|---|---|---|---|---|
| Resistance, Ω: | | | | | |
| Resistor A (.4 square) | 40 | 40.6 | 166 | 72.1 | 42.9 |
| Resistor B (.8 square) | 80 | 82.9 | 250 | 105.5 | 80.1 |
| Resistor C (1.2 squares) | 120 | 130.3 | 292 | 148 | 120 |
| Scaling: | | | | | |
| Resistor A | 1 | .955 | 1.7 | 1.5 | 1.1 |
| Resistor B | 2 | 1.9 | 2.5 | 2.1 | 2.0 |
| Resistor C | 3 | 3 | 3 | 3 | 3 |

EXAMPLE III

Pastes were prepared similar to Example I, with different amounts of palladium. After screening and firing, the alumina ceramics were fluxed with rosin dissolved in isopropyl alcohol and immersed in 10Sn:90Pb solder at 625° F. for five seconds. The immersion was repeated until the lands showed signs of erosion from the solder. Three to four such immersions without erosion is commonly considered acceptable. As seen in the following chart, 15% Pd provides excellent erosion resistance.

| Metals ratio | | | Number of 5-second immersions to produce visible erosion |
|---|---|---|---|
| Au | Pd | Ag | |
| 75 | 5 | 20 | 2 |
| 70 | 10 | 20 | 3 |
| 65 | 15 | 20 | 7 |
| 55 | 25 | 20 | >8 |

When gold:platinum lands are tinned with 10:90 Sn-Pb solder, the lands often have a shiny appearance, which is related to the removal of tin in the solder by intermetallic formation with the gold. These lead-rich land surfaces give difficulty in joining components by solder reflow techniques, such as those discussed in copending application, Ser. No. 513,412, of Merrin et al., filed Dec. 13, 1965, and assigned to the assignee of the present application, now U.S. Pat. No. 3,436,818, issued Apr. 18, 1969. The metallizing compositions described here reduce this problem significantly.

The above factors may be summarized and somewhat amplified in Table II following, which lists the materials and proportions of operable and preferred embodiments, and the effects of changes in the various constituents. The table is given merely to facilitate the understanding of the invention and is not to be construed in a limiting sense.

TABLE II

| Major constituents, operable (preferred) | Increase in concentration | Material | Ratio within constituents, operable (preferred) | Major defect | |
|---|---|---|---|---|---|
| | | | | Excess | Insufficient |
| Metal powder component, 60–72% (61.4%). | More conductance, too high fissuring, higher cost. | Gold | 40–70% (55%) | Erosion | |
| | | Silver | 5–25% (20%) | Migration | High contact resistance. |
| | | Platinum and/or palladium. | 15–35% (25%) | Increased cost | Erosion. |
| Vitreous frit, 6–10% (7.6%) | More adhesion, less tinning | Lead bisilicate | 45% | Poor tinnability | Poor adhesion. |
| | | $Bi_2O_3$ | 30% | Erosion, low adhesion | Poor tinnability. |
| | | Borosilicate glass | 25% | Poor tinnability | |
| Vehicle, 22–30% (25%) | Lower conductance, more porous, lower cost. | Solvent | 72.8% | Low viscosity | High viscosity. |
| | | Resin | 15.2% | High viscosity | Low viscosity. |
| | | Surfactant | 5.2% | | Clogging. |
| | | Sublimable solid | 6.8% | | Excess flow. |

What is claimed is:

1. A metallizing composition adapted to be deposited on an insulating substrate and fired to form a conductive element thereon comprising:

a metal powder component of, in percentages by weight gold 40–70%, silver 5–25% and a metal selected from the group consisting of platinum and palladium 15–35%, said metal powder component constituting between 60–72% of the composition;

a finely divided vitreous frit consisting of the major ingredients of lead bisilicate, bismuth trioxide and lead borosilicate glass and constituting between 6 and 10% of said composition; and an inert organic liquid vehicle in which said metal powder component and vitreous frit are dispersed constituting between 22 and 30% of said composition.

2. The composition of claim 1 wherein the said composition contains from 70 to 78% by weight solids.

3. The composition of claim 1 wherein said metal powder component comprises approximately 55% by weight gold, 20% silver and 25% of a metal selected from the group consisting of platinum and palladium.

4. The composition of claim 1 wherein said frit comprises about 45% lead bisilicate, 30% bismuth trioxide and 25% lead borosilicate glass.

5. The composition of claim 1 wherein said vehicle comprises from 10 to 20% ethyl cellulose, from 70 to 85% monobutyl ether of diethyl glycol acetate, from 0 to 10% furoic acid, and from 0 to 10% nonyl phenoxy polyoxyethylene ethanol.

6. The composition of claim 1 wherein said metal powder component comprises about 55% gold, 20% silver and 25% of a metal selected from the group consisting of platinum and palladium, said frit comprises about 45% lead bisilicate, about 30% bismuth trioxide and about 25% lead borosilicate glass and said vehicle comprises from 10 to 20% ethyl cellulose, from 70 to 85% diethylene glycol monobutyl ether acetate, from 0 to 10% furoic acid, and from 0 to 10% nonyl phenoxy polyoxyethylene ethanol.

7. The conductive element formed by firing the composition of claim 1.

8. The conductive element formed by firing the composition of claim 2.

9. The conductive element formed by firing the composition of claim 3.

10. The conductive element formed by firing the composition of claim 4.

11. The conductive element formed by firing the composition of claim 5.

12. The conductive element formed by firing the composition of claim 6.

References Cited

UNITED STATES PATENTS

| | | | |
|---|---|---|---|
| 2,610,127 | 9/1962 | Kerridge et al. | |
| 3,293,501 | 12/1966 | Martin. | |
| 3,347,799 | 10/1967 | Wagner. | |
| 3,440,182 | 4/1969 | Hoffman | 106—1 X |
| 3,450,545 | 6/1969 | Ballard et al. | 106—1 |
| 3,537,892 | 11/1970 | Milkovich et al. | 106—1 |

FOREIGN PATENTS

| | | |
|---|---|---|
| 722,116 | 11/1965 | Canada. |

LORENZO B. HAYES, Primary Examiner

U.S. Cl. X.R.

106—193 M; 117—124 C, 227; 252—514